(12) United States Patent
Kuan et al.

(10) Patent No.: US 6,916,996 B2
(45) Date of Patent: Jul. 12, 2005

(54) SYMMETRIC ELECTRICAL CONNECTION SYSTEM

(75) Inventors: Chi-Kung Kuan, Tao-Yuan Hsien (TW); Chao-Cheng Lee, Tao-Yuan Hsien (TW); Kuan-Hua Lee, Kao-Hsiung (TW)

(73) Assignee: Realtek Semiconductor Corp., Hsin-Chu Hsien (TW)

( * ) Notice: Subject to any disclaimer, the term of this patent is extended or adjusted under 35 U.S.C. 154(b) by 125 days.

(21) Appl. No.: 10/605,324

(22) Filed: Sep. 23, 2003

(65) Prior Publication Data

US 2004/0256149 A1 Dec. 23, 2004

(30) Foreign Application Priority Data

Jun. 23, 2003 (TW) ........................................ 92117015 A

(51) Int. Cl.⁷ ............................. H05K 1/11; H01R 12/04
(52) U.S. Cl. .................... 174/262; 174/255; 174/261; 257/700
(58) Field of Search ............................ 174/255, 260, 174/262, 261; 361/792, 793, 794, 795; 257/202, 211, 208, 791, 724, 700, 664, 786

(56) References Cited

U.S. PATENT DOCUMENTS

| | | | |
|---|---|---|---|
| 3,757,028 A | * | 9/1973 | Schlessel ..................... 174/33 |
| 4,717,890 A | | 1/1988 | Davis |
| 6,057,512 A | * | 5/2000 | Noda et al. .................. 174/250 |
| 6,396,000 B1 | * | 5/2002 | Baum .......................... 174/261 |
| 6,448,591 B1 | | 9/2002 | Juengling |
| 6,504,246 B2 | * | 1/2003 | Roth et al. ................... 257/750 |

* cited by examiner

Primary Examiner—Kamand Cuneo
Assistant Examiner—Ishwar (I. B.) Patel
(74) Attorney, Agent, or Firm—Winston Hsu

(57) ABSTRACT

A symmetric electrical connection system for balancing impedance between a first node and a third node and impedance between a second node and a fourth node. The system includes a first conducting wire, a third conducting wire, a fifth conducting wire, and a seventh conducting wire all installed in a first layer. The system further includes a second conducting wire, a fourth conducting wire, a sixth conducting wire, and an eighth conducting wire all installed in a second layer. The first conducting wire and the eighth conducting wire are crossed but electrically insulated. The second conducting wire and the third conducting wire are crossed but electrically insulated. The fourth conducting wire and the fifth conducting wire are crossed but electrically insulated. The sixth conducting wire and the seventh conducting wire are crossed but electrically insulated. In a preferred embodiment, the appearances and the materials of the conducting wires are essentially equivalent.

14 Claims, 6 Drawing Sheets

SYMMETRIC ELECTRICAL CONNECTION SYSTEM

BACKGROUND OF INVENTION

1. Field of the Invention

The present invention relates to a circuit layout and corresponding circuit structure, and more particularly, to a symmetricelectrical connection system.

2. Description of the Prior Art

As all kinds of electronic devices advance in their functions and operation speed, therefore accuracy control of specific components in the electronic devices becomes an important issue. Symmetric circuits such as differential circuits rely on their own symmetry so that the strict accuracy control of symmetrically installed components in the symmetric circuits is achieved. However, impedances such as parasitic capacitances, induced by circuit layouts and superposing the impedances of the symmetrically installed components, vary from structures to structures. Therefore, the resultant impedances of the symmetrically installed components cannot fill the symmetry requirement of the original design. As a result, the electronic devices using the above-mentioned symmetric circuits cannot meet predetermined specifications of the original design.

Please refer to FIG. 1 showing a circuit layout diagram of an electrical connection system 100 according to the prior art. The symmetrically installed capacitors C1, C2 are examples of the above-mentioned symmetrically installed components. The lower-left and upper-right rectangular regions shown in FIG. 1 are sub-structures composing the capacitor C1. The lower-right and upper-left rectangular regions shown in FIG. 1 are sub-structures composing the capacitor C2. Wherein the capacitance of the capacitor C1 is equal to the capacitance of the capacitor C2.

As a result of the above-mentioned symmetry requirement of the symmetrically installed components, the electrical connection system 100, for connecting the sub-structure of capacitor C1 at a first node 101 to the sub-structure of capacitor C1 at a third node 103 and for connecting the sub-structure of capacitor C2 at a second node 102 to the sub-structure of capacitor C2 at a fourth node 104, is common in many circuits. Please refer to FIG. 2 showing a three-dimensional diagram of the circuit structure of the electrical connection system 100 in FIG. 1. However, the structure of the electrical connection system 100 is asymmetrical so that the parasitic capacitance of the capacitor C1 (the capacitance induced by the system 100 and superposing the capacitance of the capacitor C1) is different from the parasitic capacitance of the capacitor C2 (the capacitance induced by the system 100 and superposing the capacitance of the capacitor C2). Therefore, the resultant impedances of the symmetrically installed components (the capacitors C1, C2) are different from each other. As a result, the symmetric circuits of this kind degrade in performance.

In conclusion, the structure of the electrical connection system 100 is asymmetric so that the structure of the combination of the electrical connection system 100 and the symmetrically installed components outside the system 100 is also asymmetric. Accordingly, the parasitic capacitances induced by the system 100 and superposing the capacitance of the symmetrically installed components are different from each other so that the resultant impedances of the symmetrically installed components are different from each other. As a result, the symmetry of the symmetrically installed components is wasted and the symmetric circuits of this kind degrade in performance.

SUMMARY OF INVENTION

It is therefore a primary objective of the claimed invention to provide a symmetricelectrical connection system to solve the above-mentioned problem.

According to the claimed invention, a symmetric electrical connection system for connecting components of a first component set and for connecting components of a second component set is provided. The symmetric electrical connection system includes a first layer and a second layer. The symmetric electrical connection system comprises a first conducting wire set for connecting between a first node and a third node, and a second conducting wire set for connecting between a second node and a fourth node. The first conducting wire set comprises: a first conducting wire installed in the first layer and electrically connected between the first node and an eighth node; a second conducting wire installed in the second layer and electrically connected between the first node and a sixth node; a third conducting wire installed in the first layer and electrically connected between the third node and the sixth node; and a fourth conducting wire installed in the second layer and electrically connected between the third node and the eighth node. Wherein the first conducting wire and the third conducting wire are symmetric with respect to a symmetry point, and the second conducting wire and the fourth conducting wire are symmetric with respect to the symmetry point. Further, The second conducting wire set comprises: a fifth conducting wire installed in the first layer and electrically connected between the second node and a fifth node; a sixth conducting wire installed in the second layer and electrically connected between the second node and a seventh node; a seventh conducting wire installed in the first layer and electrically connected between the fourth node and the seventh node; and an eighth conducting wire installed in the second layer and electrically connected between the fourth node and the fifth node. Wherein the fifth conducting wire and the seventh conducting wire are symmetric with respect to the symmetry point, and the sixth conducting wire and the eighth conducting wire are symmetric with respect to the symmetry point. In the present invention, an equivalent impedance of the first conducting wire set is substantially equal to an equivalent impedance of the second conducting wire set.

These and other objectives of the present invention will no doubt become obvious to those of ordinary skill in the art after reading the following detailed description of the preferred embodiment that is illustrated in the various figures and drawings.

DETAILED DESCRIPTION

The following embodiments of the symmetric electrical connection system can be installed on a printed circuit board, a flexible printed circuit, or in an integrated circuit. Each embodiment comprises a first layer and a second layer. Wherein the first layer in each figure is patterned with oblique lines and the second layer in each figure is patterned with blank spaces for differentiation. In addition, although the following embodiments are illustrated with slice-like conducting wires and pipe-like conducting vias, this is not a limitation. It is not necessary that the conducting wires are slice-like and the conducting vias are pipe-like while the implementation of the present invention is not hindered.

Figure 1:
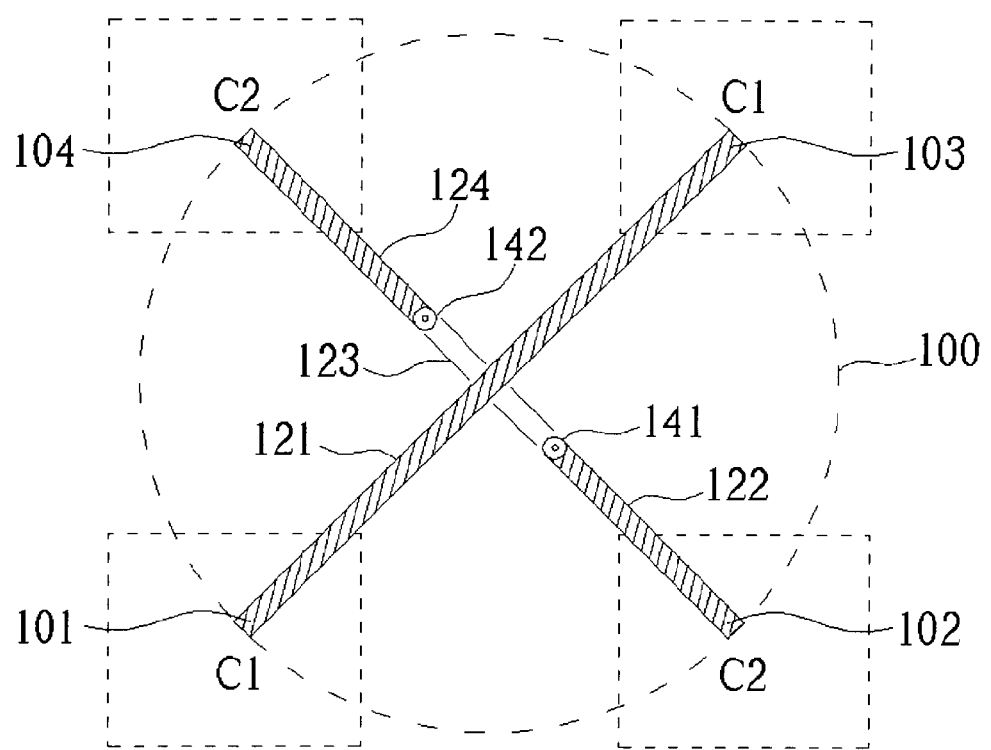
FIG. 1 is a circuit layout diagram of an electrical connection system according to the prior art.
Figure 2:
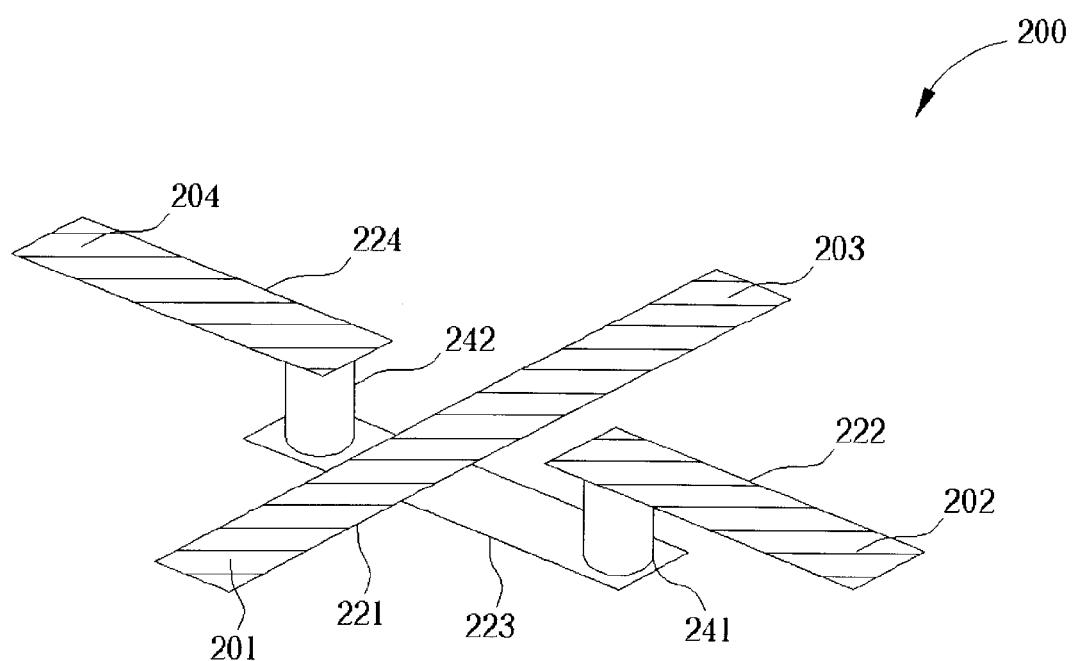
FIG. 2 is a three-dimensional diagram of a circuit structure of the electrical connection system of FIG. 1.
Figure 3:
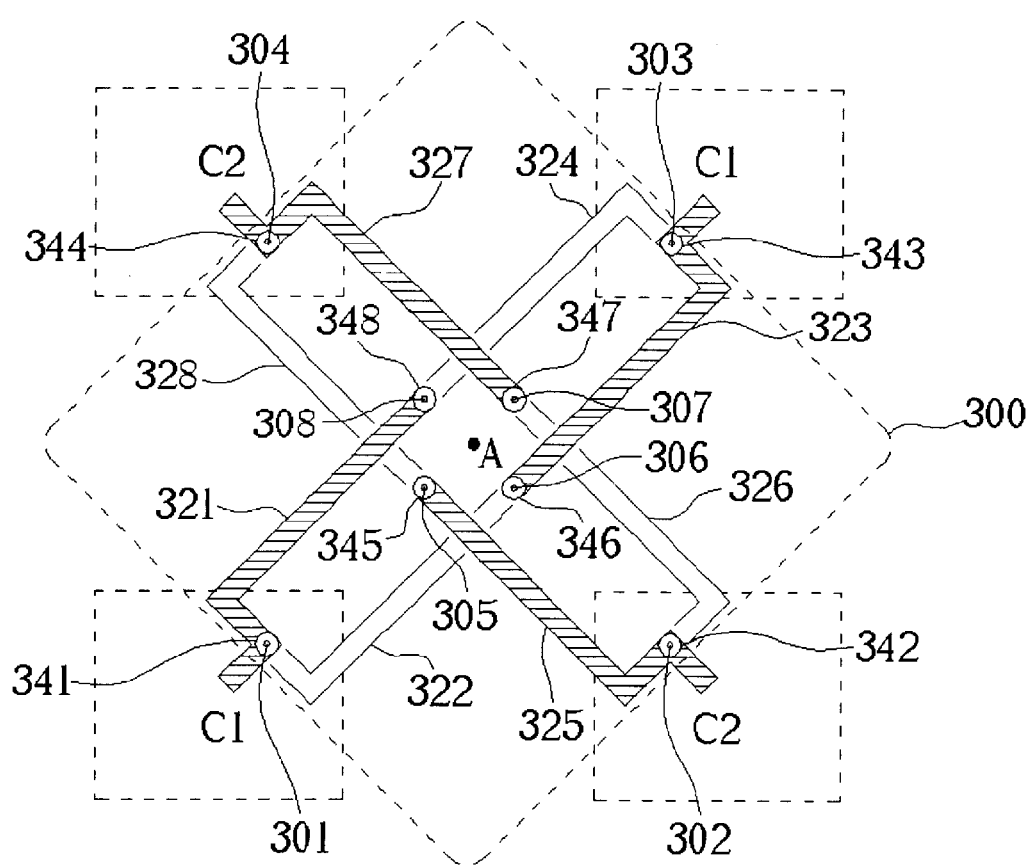
FIG. 3 is a circuit layout diagram of the symmetric electrical connection system according to the preferred embodiment of the present invention.

Please refer to FIG. 3 showing a circuit layout diagram of a symmetric electrical connection system 300 according to the present invention. The rectangular regions C1, C2 in FIG. 3 are symmetrically installed components. Further illustrated is the symmetric electrical connection system 300 for connecting components of a first component setC1 and for connecting components of a second component set C2 (the system 300 connecting the components of the setC1 together while the system 300 connecting the components of the setC2 together), wherein the first component setC1 further includes a first component and a third component, the second component setC2 further includes a second component and a fourth component, and the symmetric electrical connection system 300 includes a first layer and a second layer. The symmetric electrical connection system 300 comprises a first conducting wire set (which will be defined later) for connecting the first component at a first node 301 to the third component at a third node 303. The first conducting wire set comprises: a first conducting wire 321 installed in the first layer and electrically connected between the first node 301 and an eighth node 308; a second conducting wire 322 installed in the second layer and electrically connected between the first node 301 and a sixth node 306; a third conducting wire 323 installed in the first layer and electrically connected between the third node 303 and the sixth node 306; and a fourth conducting wire 324 installed in the second layer and electrically connected between the third node 303 and the eighth node 308. Wherein the first conducting wire 321 and the third conducting wire 323 are symmetric with respect to a symmetry point A, and the second conducting wire 322 and the fourth conducting wire 324 are symmetric with respect to the symmetry point A.

The symmetric electrical connection system 300 further comprises a second conducting wire set (which will be defined later) for connecting the second component at a second node to the fourth component at a fourth node. The second conducting wire set comprises: a fifth conducting wire 325 installed in the first layer and electrically connected between the second node 302 and a fifth node 305; a sixth conducting wire 326 installed in the second layer and electrically connected between the second node 302 and a seventh node 307; a seventh conducting wire 327 installed in the first layer and electrically connected between the fourth node 304 and the seventh node 307; and an eighth conducting wire 328 installed in the second layer and electrically connected between the fourth node 304 and the fifth node 305. Wherein the fifth conducting wire 325 and the seventh conducting wire 327 are symmetric with respect to the symmetry point A, and the sixth conducting wire 326 and the eighth conducting wire 328 are symmetric with respect to the symmetry point A. Wherein an equivalent impedance of the first conducting wire set is equal to an equivalent impedance of the second conducting wire set.

In the embodiment of FIG. 3, the system 300 further comprises an insulation layer (not shown in FIG. 3) between the first layer and the second layer. The conducting wires installed in the first layer are electrically connected to the conducting wires installed in the second layer by a plurality of conducting vias 341, 342, 343, 344, 345, 346, 347, 348. The circuit structure as seen from any node of the external nodes (the first node 301, the second node 302, the third node 303, and the fourth node 304) of the symmetric electrical connection system 300 is equivalent to the circuit structure as seen from the other three external nodes. Therefore, the symmetric structure of the symmetric electrical connection system 300 and the symmetrically installed components C1, C2 outside the system 300 can compose a symmetric circuit that is completely symmetric. That is, the conducting wires connected to the component C1 are symmetric with respect to the symmetry point A, and the conducting wires connected to the component C2 are symmetric with respect to the symmetry point A. Further, the first conducting wire set (the conducting wires 321, 322, 323, 324 connected to the component Cl) and the second conducting wire set (the conducting wires 325, 326, 327, 328 connected to the component C2) are symmetric with respect to the symmetry point A. Accordingly, an equivalent impedance of the first conducting wire set is substantially equal to an equivalent impedance of the second conducting wire set.

While the conducting wires of the embodiment of FIG. 3 are crossed but electrically insulated, this is not a limitation of the present invention. For example, there can be the same electrical leakage characteristics (or the same induced impedance) at the crossed areas and the situation does not hinder the implementation of the present invention. Further, specific impedance components can be installed at the crossed areas while the impedance symmetry as seen from the external nodes of the symmetric electrical connection system 300 is preserved, and the implementation of the present invention is not hindered.

As for some implementation details of the embodiment of FIG. 3, all the conducting wires and conducting vias are made of metal. The conducting wires and conducting vias can be made of other conductive materials while implementation of the present invention is not hindered.

Figure 4:
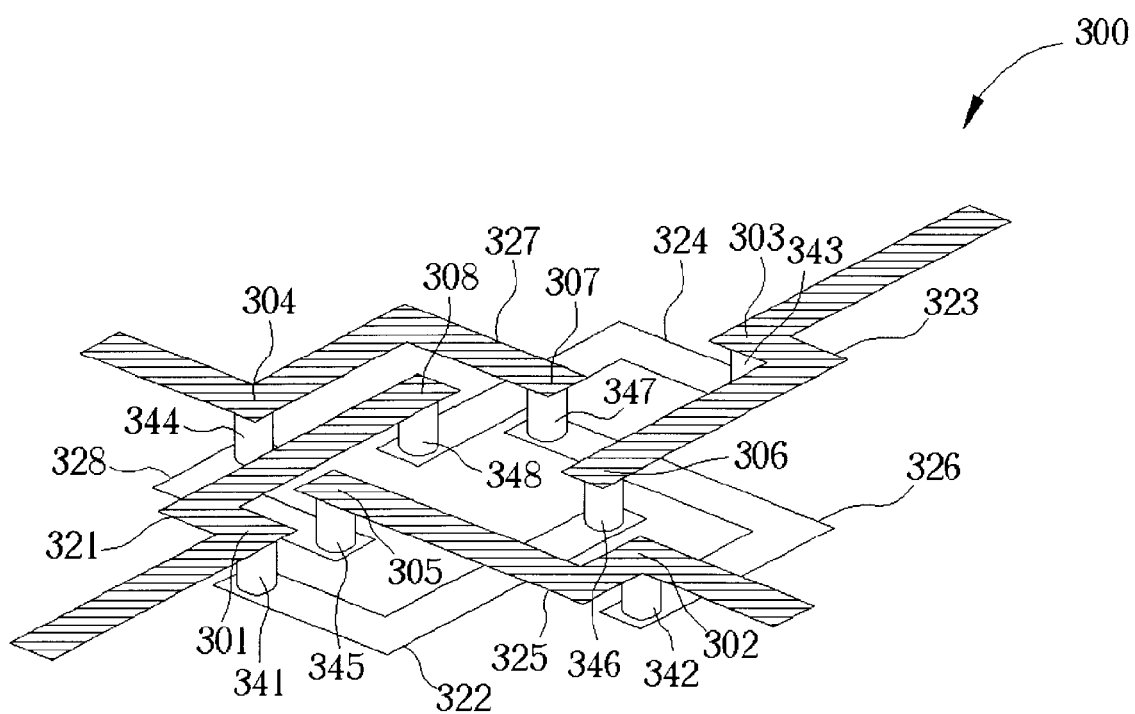
FIG. 4 is a three-dimensional diagram of the circuit structure of the symmetric electrical connection system in FIG. 3 of the present invention.

Please refer to FIG. 4 showing a three-dimensional diagram of a circuit structure of the symmetric electrical connection system of FIG. 3.

Figure 5:
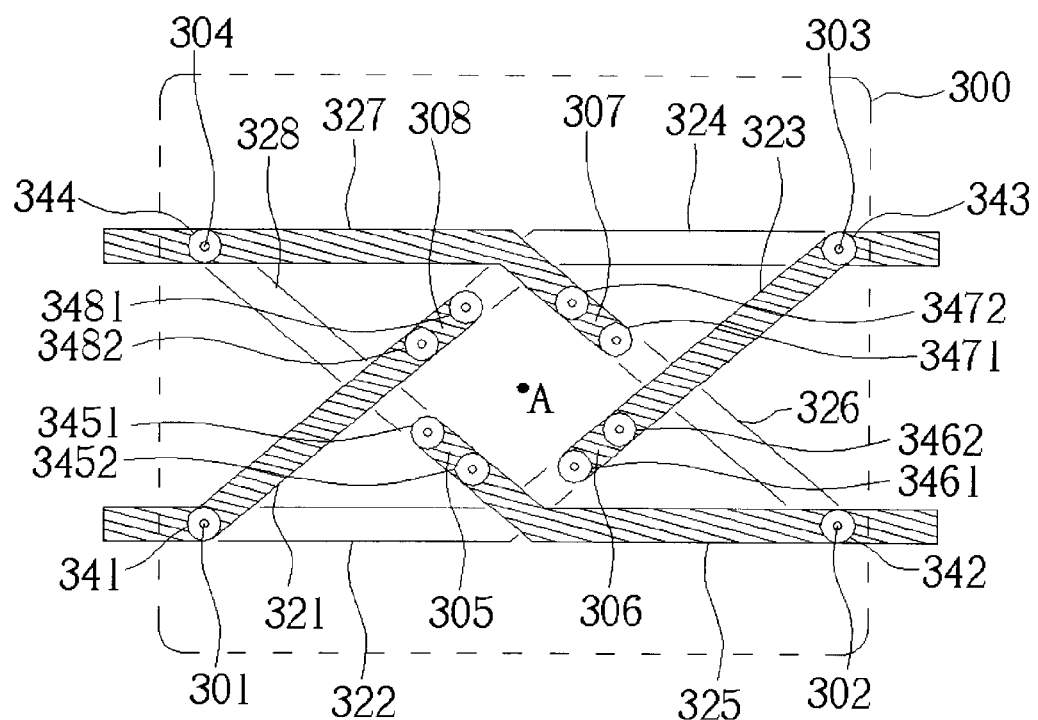
FIG. 5 is a circuit layout diagram of the symmetric electrical connection system according to the present invention.

Please refer to FIG. 5 showing the second embodiment of the symmetric electrical connection system according to the present invention. The difference between the embodiments of FIG. 5 and FIG. 3 is that the lengths and shapes of the conducting wires of FIG. 5 are not completely identical and the number of conducting vias connected to adjacent conducting wires is not limited to one. However, the embodiment of FIG. 5 preserves the symmetry of the conducting wire sets as in FIG. 3 so that the equivalent impedances of the conducting wire sets are substantially the same.

Figure 6:
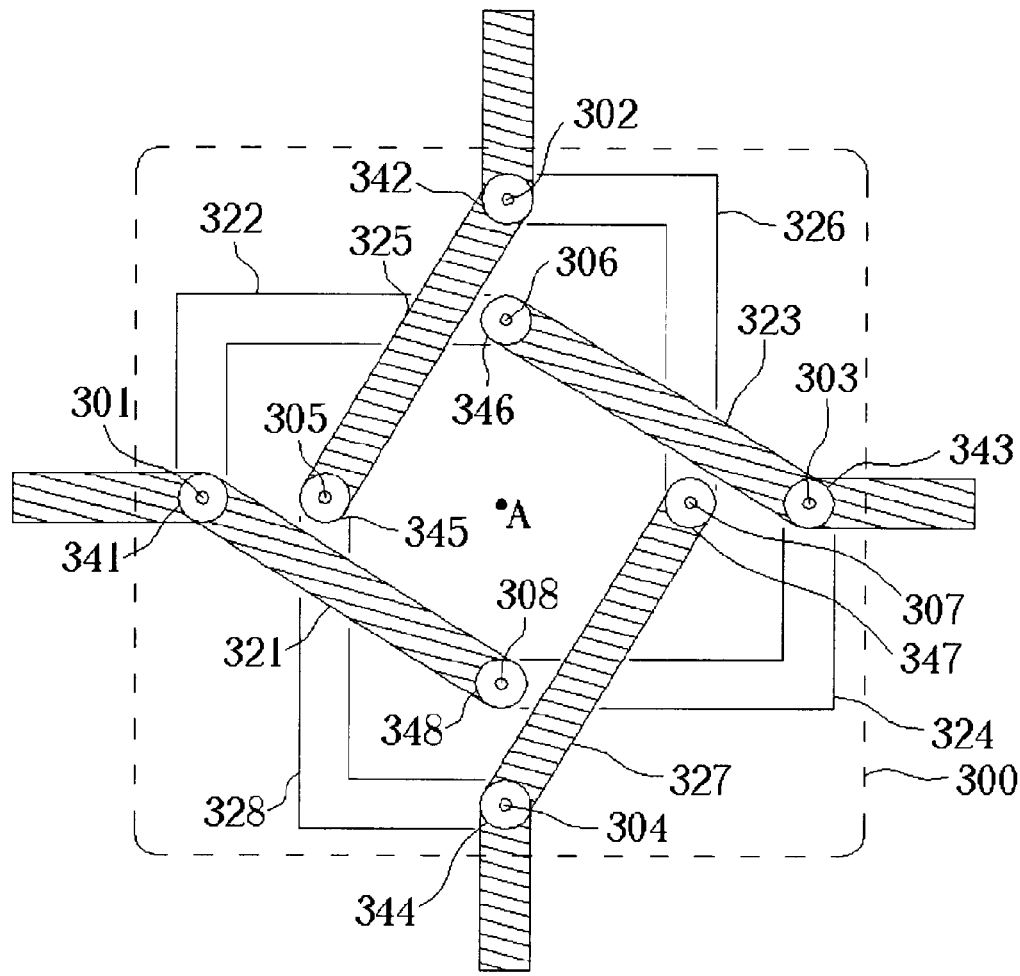
FIG. 6 is a circuit layout diagram of the symmetric electrical connection system according to the present invention.

Please refer to FIG. 6 showing the third embodiment of the symmetric electrical connection system according to the present invention. Of concern, although there is a difference between the embodiments of FIG. 6 and FIG. 3 that the lengths and shapes of the conducting wires of FIG. 6 are not completely identical, the embodiments of FIG. 6 preserves the symmetry of the conducting wire sets of the embodiment in FIG. 3 so that the equivalent impedances of the conducting wire sets are substantially the same.

In contrast to the prior art, the circuit structure as seen from any node of the external nodes (the first node, the second node, the third node, and the fourth node) of the symmetric electrical connection system of the present invention is equivalent to the circuit structure as seen from the other three external nodes, so that the impedance characteristic from any node of the external nodes (the first node, the second node, the third node, and the fourth node) of the symmetric electrical connection system of the present invention is equivalent to the impedance characteristic from the other three external nodes. Therefore, the symmetric electrical connection system can provide the symmetrically installed components outside the system with equivalent impedance characteristics. As a result, the symmetry of the symmetrically installed components, which are installed to solve the problem of directional gradient variance of material characteristics or that due to the production process, is not wasted and the symmetric circuits of this kind are led to full performance.

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A symmetric electrical connection system for connecting components of a first component set and for connecting components of a second component set, wherein the first component set includes a first component and a third component, the second component set includes a second component and a fourth component, and the symmetric electrical connection system includes a first layer, a second layer, the symmetric electrical connection system comprising:

a first conducting wire set for connecting the first component at a first node to the third component at a third node, the first conducting wire set comprising:

a first conducting wire installed in the first layer and electrically connected between the first node and an eighth node;

a second conducting wire installed in the second layer and electrically connected between the first node and a sixth node;

a third conducting wire installed in the first layer and electrically connected between the third node and the sixth node; and a fourth conducting wire installed in the second layer and electrically connected between the third node and the eighth node;

wherein the first conducting wire and the third conducting wire are symmetric with respect to a symmetry point, and the second conducting wire and the fourth conducting wire are symmetric with respect to the symmetry point;

a second conducting wire set for connecting the second component at a second node to the fourth component at a fourth node, the second conducting wire set comprising:

a fifth conducting wire installed in the first layer and electrically connected between the second node and a fifth node;

a sixth conducting wire installed in the second layer and electrically connected between the second node and a seventh node;

a seventh conducting wire installed in the first layer and electrically connected between the fourth node and the seventh node; and an eighth conducting wire installed in the second layer and electrically connected between the fourth node and the fifth node;

wherein the fifth conducting wire and the seventh conducting wire are symmetric with respect to the symmetry point, and the sixth conducting wire and the eighth conducting wire are symmetric with respect to the symmetry point;

wherein an equivalent impedance of the first conducting wire set is equal to an equivalent impedance of the second conducting wire set.

2. The system of claim 1, further comprising an insulation layer between the first layer and the second layer.

3. The system of claim 2, wherein the conducting wires installed in the first layer are electrically connected with the conducting wires installed in the second layer using a plurality of conducting vias.

4. The system of claim 1, wherein the system is installed on a printed circuit board.

5. The system of claim 1, wherein the system is installed in an integrated circuit.

6. The system of claim 1, wherein the first component and the second component are substantially equivalent, and the third component and the fourth component are substantially equivalent.

7. The system of claim 6, wherein the first component, the second component, the third component, and the fourth component are substantially equivalent.

8. The system of claim 1, wherein the first conducting wire set and the second conducting wire set are crossed each other and electrically insulated.

9. A symmetric electrical connection system for connecting a first component at a first node to a second component at a third node, wherein the symmetric electrical connection system includes a first layer and a second layer, the symmetric electrical connection system comprising:

a first conducting wire installed in the first layer and electrically connected between the first node and a second node;

a second conducting wire installed in the second layer and electrically connected between the first node and a fourth node;

a third conducting wire installed in the first layer and electrically connected between the third node and the fourth node; and a fourth conducting wire installed in the second layer and electrically connected between the third node and the second node respectively;

wherein the first conducting wire and the third conducting wire are symmetric with respect to a symmetry point, and the second conducting wire and the fourth conducting wire are symmetric with respect to the symmetry point.

10. The system of claim 9, further comprising an insulation layer between the first layer and the second layer.

11. The system of claim 10, wherein the conducting wires installed in the first layer are electrically connected with the conducting wires installed in the second layer using a plurality of conducting vias.

12. The system of claim 9, wherein the system is installed on a printed circuit board.

13. The system of claim 9, wherein the system is installed in an integrated circuit.

14. The system of claim 9, wherein the first component and the second component are substantially equivalent.

* * * * *